United States Patent [19]
Lewis

[11] Patent Number: 5,317,214
[45] Date of Patent: May 31, 1994

[54] INTERFACE CIRCUIT HAVING DIFFERENTIAL SIGNAL COMMON MODE SHIFTING MEANS

[75] Inventor: Edward T. Lewis, Sudbury, Mass.

[73] Assignee: Raytheon Company, Lexington, Mass.

[21] Appl. No.: 28,511

[22] Filed: Mar. 9, 1993

[51] Int. Cl.$^5$ .......................................... H03K 19/003
[52] U.S. Cl. .................................... 307/475; 307/443; 307/494
[58] Field of Search ............... 307/443, 448, 455, 475, 307/494–495, 562

[56] References Cited

U.S. PATENT DOCUMENTS

| | | | |
|---|---|---|---|
| 4,684,831 | 8/1987 | Kruest | 307/475 |
| 4,994,691 | 2/1991 | Naghshineh | 307/443 X |
| 5,077,496 | 12/1991 | Wolczanski | 307/475 |

Primary Examiner—David R. Hudspeth
Attorney, Agent, or Firm—R. M. Sharkansky

[57] ABSTRACT

An interface circuit for converting a differential input voltage, having a common-mode level within a first range, into a differential output voltage having a different, common-mode level. The circuit feeds current between a pair of variable current sources and a pair of input terminals adapted to receive the differential input voltage through a pair of resistors. The amount of current passing through the pair of resistors is related to the common-mode level of the input signal. The resistors produce the differential output voltage at the pair of output terminals with a common-mode level related to the common-mode level of the input voltage translated an amount related to the amount of current passing through them.

6 Claims, 1 Drawing Sheet

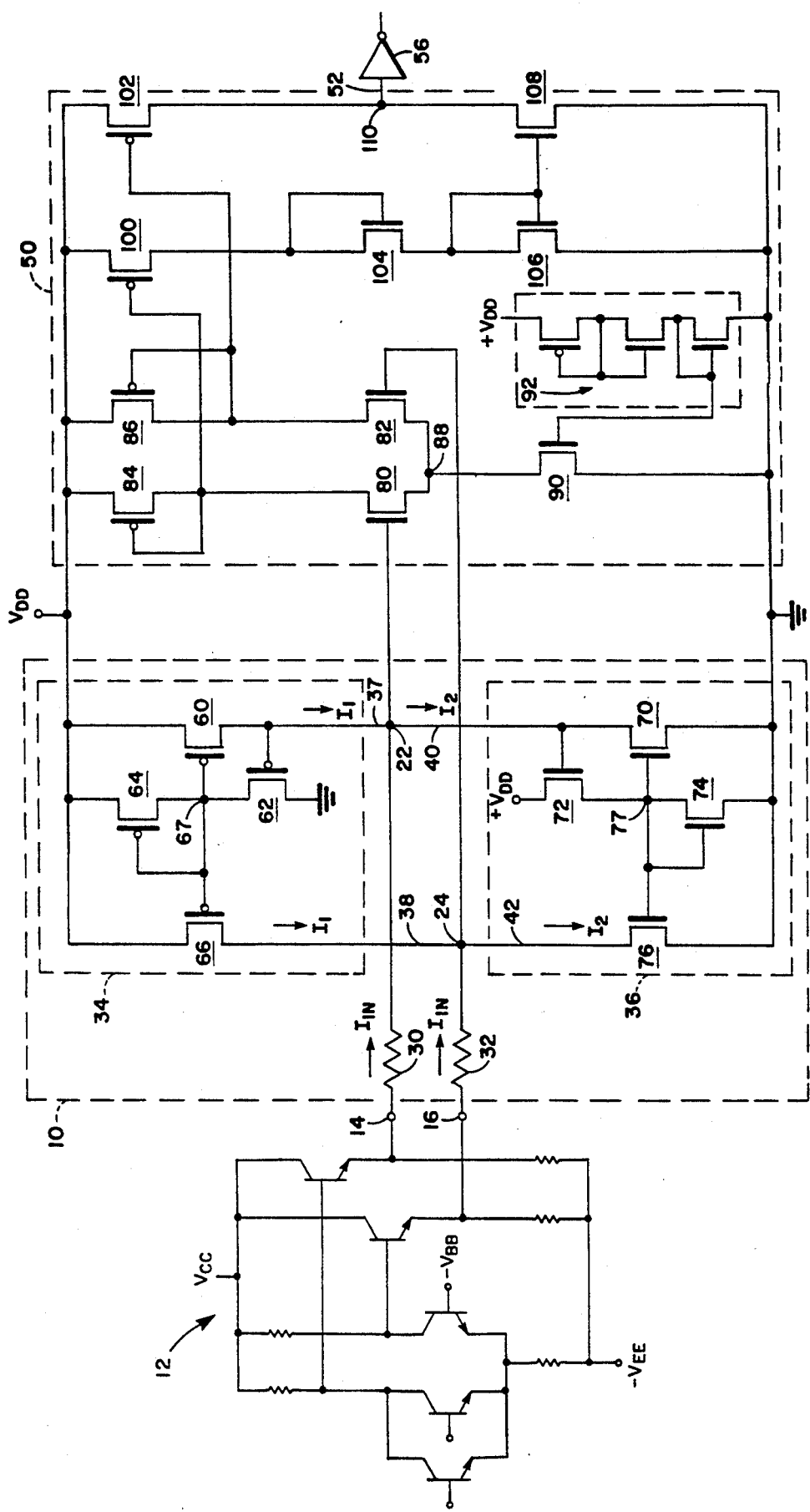

INTERFACE CIRCUIT HAVING DIFFERENTIAL SIGNAL COMMON MODE SHIFTING MEANS

BACKGROUND OF THE INVENTION

This invention relates generally to interface circuits, and more particularly to circuits used to interface between an output signal produced by one type of integrated circuit technology, such as emitter coupled logic (ECL) technology, and an input signal used by another type of integrated circuit technology, such as complementary metal oxide semiconductor (CMOS) technology.

As is known in the art, it is sometimes desirable to provide an interface circuit adapted to operate with a variety of integrated circuit technologies, each of which has been optimally designed to operate with a different power supply. The integrated circuit technologies typically perform a myriad of analog and digital functions. These integrated circuit technologies may consist of devices and circuit structures bases on bipolar, GaAs, or MOS technologies, to name but a few. Quite often, it is required to design a digital processor based on one of these technologies, yet which may accept inputs from another one of the technologies.

One notable interface problem that is very common in current state-of-the-art digital system design is interfacing between the outputs produced by ECL technology and a digital processor made up of CMOS technology. Traditional ECL integrated circuit designs utilize a negative power supply and generate differential output voltages ranging around several hundred millivolts (i.e. the difference in voltage levels between a logic 0 signal and a logic 1 signal is about 400 millivolts). These differential output voltages have an average voltage level, generally referred to as a common-mode level. The common-mode level for ECL technology can range from a negative potential to a positive potential, and can have a magnitude ranging from several volts to ground. CMOS digital integrated circuit technology, on the other hand, is typically designed to operate with a positive power supply (typically V+ about 5 volts, V− about ground potential). The input and output logic voltage levels typically have a nominal level (i.e. common-mode level) of 2.5 volts with one logic state represented by 3.5 volts and the other logic state represented by 1.5 volts.

One technique used to interface between these two types of integrated circuit technologies is to shift the power supply reference for either the ECL circuit or the CMOS circuit so that the total system operates around one power supply (either (+) or (−)). However, this is sometimes not possible in some applications. Further, the technique may not be applicable in interfacing between other types of technology.

SUMMARY OF THE INVENTION

With this background of the invention in mind, it is therefore an object of this invention to provide an improved interface circuit.

It is another object of the invention to provide a circuit for converting the levels of signals developed by a first integrated circuit technology into levels adapted for use by a second integrated circuit technology, the converting circuit being adapted to operate with the same power supply used for the second integrated circuit technology.

It is a further object of the invention to provide a circuit for interfacing signals produced from any one of a variety of integrated circuit technologies having relatively small differential voltage levels, and a common-mode level which can range from a negative potential to a positive potential, into a signal suitable for use by a circuit having CMOS technology, such interfacing circuit operating with the same power supply as the CMOS circuit.

These and other objects of the invention are attained generally by providing an interface circuit for converting an input voltage adapted to vary between two levels having a common-mode level, into an output voltage having a level varying, correspondingly, between two levels with a different, common-mode level. The interface circuit includes: a voltage level shifting means; a current source; and, means for feeding current between the current source and an input terminal adapted to receive the input voltage, such current passing through the voltage level shifting means. The amount of current passing through the voltage level shifting means is related to the level of the input voltage. The voltage level shifting means produces the output voltage at an output terminal with a level related to the level of the input voltage translated an amount related to the amount of current passing through the voltage level shifting means.

In a preferred embodiment, means, including a second source, is provided, for passing current through the voltage level shifting means, the amount of current being related to the level of the input voltage. The voltage level shifting means provides the output voltage with a level related to the level of the input voltage translated an amount related to the difference between the amount of current passing through the voltage level shifting means by the first mentioned current source and the amount of current passing through the voltage level shifting means by the second current source.

In accordance with a feature of the invention, a differential amplifier is provided. The differential amplifier is fed by the output voltage and produces a voltage adapted to vary between two fixed voltage levels independent of the common-mode level of the input voltage.

In accordance with a preferred embodiment of the invention, an interface circuit is provided for converting a differential input voltage, having a common-mode level within a first range, into a differential output voltage having a different, common-mode level. The interface circuit includes: first and second voltage level shifting means; first and second sources of current; and, means for feeding current between the first and second sources and a pair of input terminals adapted to receive the differential input voltage, such current passing through the first and second voltage level shifting means. The amount of current passing through the first and second voltage level shifting means is related to the common-mode level of the input signal. The voltage level shifting means produces the differential output voltage at the pair of output terminals with a common-mode level related to the common-mode level of the input voltage translated an amount related to the amount of current passing through the first and second voltage level shifting means.

BRIEF DESCRIPTION OF THE DRAWINGS

For a more complete understanding of the concepts of the invention, as well as the invention itself, reference is now made to the following description taken together in connection with the single FIGURE which is a schematic diagram of an interface circuit according to the invention, such circuit being shown to interface between an ECL circuit and a CMOS circuit.

DESCRIPTION OF THE PREFERRED EMBODIMENTS

An interface circuit 10 is shown for converting voltages produced by a first integrated circuit technology, here an ECL logic gate 12, into voltages suitable for use by a second integrated circuit technology, here CMOS technology. Thus, here the ECL logic gate 12 produces "true" and "complementary" logic signals on a pair of input terminals 14, 16 of the interface circuit 10. Here, the voltage on "true" terminal 14 representing a logic 1 state is $V_{14}=V_{icm}+\Delta/2$ and the voltage representing a logic 0 state is $V_{14}=V_{icm}-\Delta/2$, while the voltage on the "complementary" terminal 16 representing a logic 1 state is $V_{16}=V_{icm}-\Delta/2$ and the voltage representing a logic 0 state is $V_{16}=V_{icm}+\Delta/2$. Thus, the input voltage, $V_i$, at the pair of input terminals 14, 16 is a differential input voltage, $V_{di}=\pm\Delta$ is produced between the pair of input terminals 14, 16 having a common-mode level $V_{icm}$.

The interface circuit 10 converts the input voltage, $V_i$, at the pair of input terminals 14, 16 into a output voltage, $V_o$, between a pair of output terminals 22, 24. The output voltage produced at output terminal 22 is $V_{22}=V_{ocm}+\delta/2$ when the voltage at input terminal 14 is $V_{14}=V_{icm}+\Delta/2$, and the voltage at such output terminal 22 is $V_{22}=V_{ocm}-\delta/2$ when the voltage at input terminal 14 is $V_{14}=V_{icm}-\Delta/2$. Likewise, the output voltage produced at output terminal 24 is $V_{24}=V_{ocm}-\delta/2$ when the voltage at input terminal 16 is $V_{16}=V_{icm}-\Delta/2$, and the voltage at such output terminal 24 is $V_{24}=V_{ocm}+\delta/2$ when the voltage at input terminal 16 is $V_{16}=V_{icm}+\Delta/2$.

The input voltage, $V_i$, between input terminals 14, 16 has a common-mode level, $V_{icm}$, within a first range, $R_1$. Here, the interface circuit 10 is adapted to operate with input voltages having a common-mode level, $V_{icm}$, which ranges from $-7$ volts to $+7$ volts (i.e. $R_1=14$ volts). The interface circuit 10 is adapted to produce the output, $V_o$, between output terminals 22, 24 with a different, common-mode level, $V_{ocm}$, within a range, $R_2$. Here, the interface circuit 10 produces an output voltage $V_o$ with a common-mode level, $V_{ocm}$, in the range, $R_2$, between $+1.5$ volts and $+3.5$ volts. That is, here, if the input voltage $V_i$ has a common-mode level, $V_{icm}$, at the minimum level $V_{icmMIN}$ in the range, $R_1$ (i.e. $-7$ volts), the common-mode level, $V_{ocm}$, of the output voltage $V_o$ will be at the minimum level $V_{ocmMIN}$ in the range $R_2$ (i.e. $+1.5$ volts). On the other hand, if the common-mode level, $V_{icm}$, of the input voltage $V_i$ is at the maximum level, $V_{icmMAX}$ in the range $R_1$ (i.e. $+7$ volts), the common-mode level, $V_{ocm}$ of the output voltage, $V_{ocm}$, will be at the maximum level, $V_{ocmMAX}$ (i.e. $+3.5$ volts). Here, the differential input voltage $\Delta$ is 400 millivolts.

The interface circuit 10 includes: first and second voltage level shifting elements, here first and second resistors 30, 32, and first and second sources of current 34, 36. The amount of current, $I_{in}$, fed through the resistors 30, 32 by the sources of current 34, 36 is related to the common-mode level, $V_{icm}$, of the input signal, $V_i$. The resistors 30, 32 produce the output voltage, $V_o$, at the pair of output terminals 22, 24 with a common-mode level, $V_{ocm}$, related to the common-mode level, $V_{icm}$, of the input voltage, $V_i$, translated an amount, $I_{in}R$, (where R is the resistance of resistors 30, 32). That is $V_{ocm}=V_{icm}+I_{in}R$.

The current $I_{in}$ is equal to the algebraic sum of a current, $I_1$, produced by the first source 34 on lines 37, 38 and a current, $I_2$, produced by the second source 36 on lines 40, 42. The amount of current $I_{in}$ fed through the resistors 30, 32 is related to the common-mode level, $V_{ic}$, of an input voltage, $V_i$, fed to the pair of input terminals 14, 16. Ideally, the current $I_1=[(I_{1MAX})/(V_{icmMAX}-V_{icmMIN})][V_{icm}+V_{icmMAX}]$, where $I_{1MAX}=(V_{icmMAX}-V_{ocmMAX})/R$ and the current $I_2=[(I_{2MAX})/(V_{icmMAX}-V_{icmMAX})][V_{icmMAX}-V_{icm}]$, where $I_{2MAX}=(V_{icmMIN}-V_{ocmMIN})/R$, where R is the resistance of resistors 30, 32, here R is 10K ohms. Thus, here $I_{1MAX}=350$ microamps, $I_{2MAX}=-850$ microamps, $I_1=[(350 \text{ microamps})/(14 \text{ volts})][V_{icm}+7 \text{ volts}]=(350/2)+(350/14)V_{icm}$ microamps, $a_2=[(-850 \text{ microamps})/(14 \text{ volts})][7 \text{ volts}-V_{icm}]=-850/2+(850/14)V_{icm}$ microamps. It is noted that the currents $I_1$ and $I_2$ are a function of the input voltage, $V_i$, common-mode level, $V_{icm}$. More particularly, the current $I_1$ varies from zero to 350 microamps, and the current $I_2$ varies from $-850$ microamps to zero, as the common-mode input voltage, $V_{icm}$ varies from $-7$ volts to $+7$ volts. Thus, the output voltage, $V_o$, common-mode, $V_{ocm}$, varies from $+1.5$ volts to $+3.5$ volts level while the common-mode input voltage, $V_{icm}$ varies from $-7$ volts to $+7$ volts.

A differential amplifier 50 is provided. The differential amplifier 50 is fed by the output voltage, $V_o$, produced at the pair of output terminals 22, 24 and produces a voltage on line 52 adapted to vary between two fixed voltage levels, here between ground and $+5$ volts, respectively, as the input differential voltage, $V_i$, varies between $(-\Delta)$ and $(+\Delta)$, respectively, independent of where the common-mode level, $V_{ic}$, of the input signal, $V_i$, is within the range $R_1$ (i.e., between $-7$ and $+7$ volts). The output of the differential amplifier 50 is fed to a conventional CMOS inverter 56. Inverter 56 produces either a logic 1 or logic 0 signal selectively in accordance with the level of the voltage produced by the differential amplifier 50 on line 52. Thus, as is well known, when the level of the voltage on line 52 is near ground, a logic 1 signal, here $+5$ volts, is produced by inverter 50; whereas, if the level of the voltage on line 52 is near $+5$ volt level is produced on line 52 a logic 0 signal, here 0 volts, is produced by the inverter 56.

Referring now in more detail to the first source of current 34, p-channel MOS transistors 60, 62, 64, 66 are arranged, as shown, to provide an amount of current through transistor 62 which is a function of the level of the voltage on the gate electrode thereof (i.e. here the voltage at output terminal 22). The current through transistor 62 is mirrored by transistors 60 and 66 to thereby produce the current $I_1$ on lines 36, 38. The second source of current 36 includes n-channel MOS transistors 70, 72, 74, 76 are arranged, as shown, to function in a manner equivalent to transistors 60, 62, 64, 66, respectively. Therefore, an amount of current through transistor 72 which is a function of the level of the voltage on the gate electrode thereof (i.e. here the voltage at output terminal 22). The current through transistor 72 is mirrored by transistors 70 and 76 to thereby produce the current I. on lines 40, 42. More particularly, transistor 64 has its source electrode connected to a $V_{DD}$ power supply, here a $+5$ volt supply, and its gate and drain electrodes connected together, as shown, to form a diode-connected transistor. Likewise, the source electrodes of transistors 60, 66 are connected to the $V_{DD}$ supply, as shown. The gate electrodes of transistors 60, 64, 66 are connected to a common node 67, as shown. The drain electrode of transistor 62 is connected to ground potential. Transistor 72 has its drain electrode connected to the $V_{DD}$ power supply. Transistor 74 has its gate and drain electrodes connected together, as shown, to form a diode-connected transistor. The source electrodes of transistors 70, 74, 76 are connected to ground potential, as shown. The gate electrodes of transistors 70, 74, 76 are connected to a common node 77, as shown.

The differential amplifier 50 includes n-channel MOS transistors 80, 82 arranged as a differential pair, as shown. Thus, the drain electrodes thereof are coupled to the $V_{DD}$ power supply through a pair of diode connected transistors 84, 86, here p-channel MOS devices, as shown, and the source electrodes thereof are connected at a common terminal 88, as shown. The terminal 88 is coupled to ground potential through a transistor 90, such transistor having its gate electrode biased to a fixed positive potential by biasing network 92. The output of the differential pair of transistors 80, 82 is coupled the gate electrodes of transistors 100, 102, as shown. The source electrodes of these transistors 100, 102 are coupled to the $V_{DD}$ supply, as shown. The drain electrode of transistor 100 is coupled to ground through a pair of serially connected, diode connected transistors 104, 106, as shown. The drain electrode of transistor 102 and the drain electrode of grounded source electrode transistor 108 are connected to terminal 110. Terminal 110 provides the input to inverter 56.

Having described a preferred embodiment of the invention, it will now be apparent to one of skill in the art that other embodiments incorporating its concepts may be used. It is felt, therefore, that this invention should not be restricted to the preferred embodiment but rather shown be limited only by the spirit and scope of the appended claims.

What is claimed is:

1. An interface circuit for converting a differential input voltage having a common-mode level into an output voltage having a different, common-mode level, the interface circuit comprising:
   a voltage level shifting means;
   a current source; and
   means for feeding current between the current source and an input terminal adapted to receive the differential input voltage, such current passing through the voltage level shifting means an amount related to the level of the differential input voltage.

2. The interface circuit recited in claim 1, wherein the voltage level shifting means includes means for producing the output voltage at an output terminal with a level related to the level of the differential input voltage translated an amount related to the amount of current passing through the voltage level shifting means.

3. The interface circuit recited in claim 1 including means, including a second source, for passing current through the voltage level shifting means, the amount of current being related to the level of the differential input voltage.

4. The interface circuit recited in claim 3 wherein the voltage level shifting means includes means for providing the output voltage with a level related to the level of the differential input voltage translated an amount related to the difference between the amount of current passing through the voltage level shifting means by the first mentioned current source and the amount of current passing through the voltage level shifting means by the second current source.

5. The interface circuit recited in claim 3 including a differential amplifier fed by the output voltage for producing a voltage adapted to vary between two predetermined voltage levels independent of the common-mode level of the differential input voltage.

6. An interface circuit for converting a differential input voltage, having a common-mode level within a first range, into a differential output voltage having a different, common-mode level, comprising:
   first and second voltage level shifting means;
   first and second sources of current;
   means for feeding current between the first and second sources and a pair of input terminals adapted to receive the differential input voltage, such current passing through the first and second voltage level shifting means, the amount of current passing through the first and second voltage level shifting means being related to the common-mode level of the input signal; and
   wherein the voltage level shifting means produces the differential output voltage at the pair of output terminals with a common-mode level related to the common-mode level of the input voltage translated an amount related to the amount of current passing through the first and second voltage level shifting means.

* * * * *